United States Patent [19]

Whitsitt

[11] Patent Number: 5,065,141
[45] Date of Patent: Nov. 12, 1991

[54] EXPANDED REGISTER RACK FOR A PROGRAMMABLE LOGIC CONTROLLER

[75] Inventor: Steven L. Whitsitt, Waukesha, Wis.

[73] Assignee: Square D Company, Palatine, Ill.

[21] Appl. No.: 322,834

[22] Filed: Mar. 13, 1989

[51] Int. Cl.$^5$ .............................................. G08B 21/00
[52] U.S. Cl. .................................... 340/635; 340/636; 361/415; 361/393; 307/150
[58] Field of Search ............... 340/636, 635; 361/415, 361/392–394; 307/64, 65, 150

[56] References Cited

U.S. PATENT DOCUMENTS

| | | | |
|---|---|---|---|
| 4,151,580 | 4/1979 | Struger et al. | 361/415 |
| 4,675,538 | 6/1987 | Epstein | 361/415 |
| 4,675,539 | 6/1987 | Nichol | 307/65 |

Primary Examiner—Donnie L. Crosland
Assistant Examiner—Jeffery A. Hofsass
Attorney, Agent, or Firm—Michael J. Femal; Thomas K. Stine

[57] ABSTRACT

An expanded register rack assembly is for a processor based device. The expanded register rack assembly has a first board register rack assembly having multiple slots for receiving multiple electronic modules including a programmable controller module. The expanded register rack also has a second register rack having multiple slots for receiving multiple electronic modules. The expanded register rack assembly further has a communicative coupling between the first and second board racks, the communicative coupling permitting the programmable controller module to selectively access any of the other electronic modules received in the first and second multiple slots without the need for communication hardware mounted in any of the slots.

2 Claims, 3 Drawing Sheets

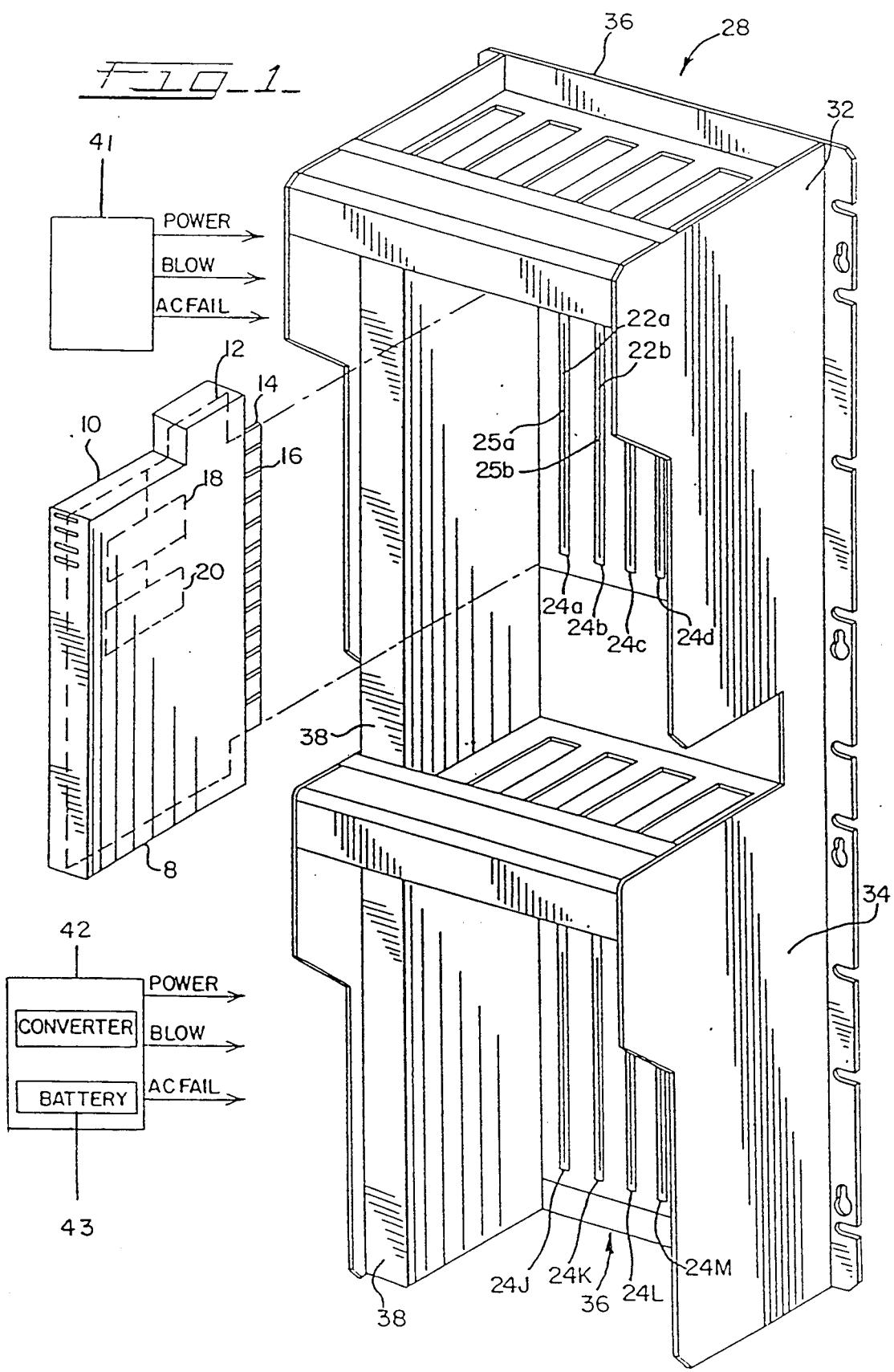

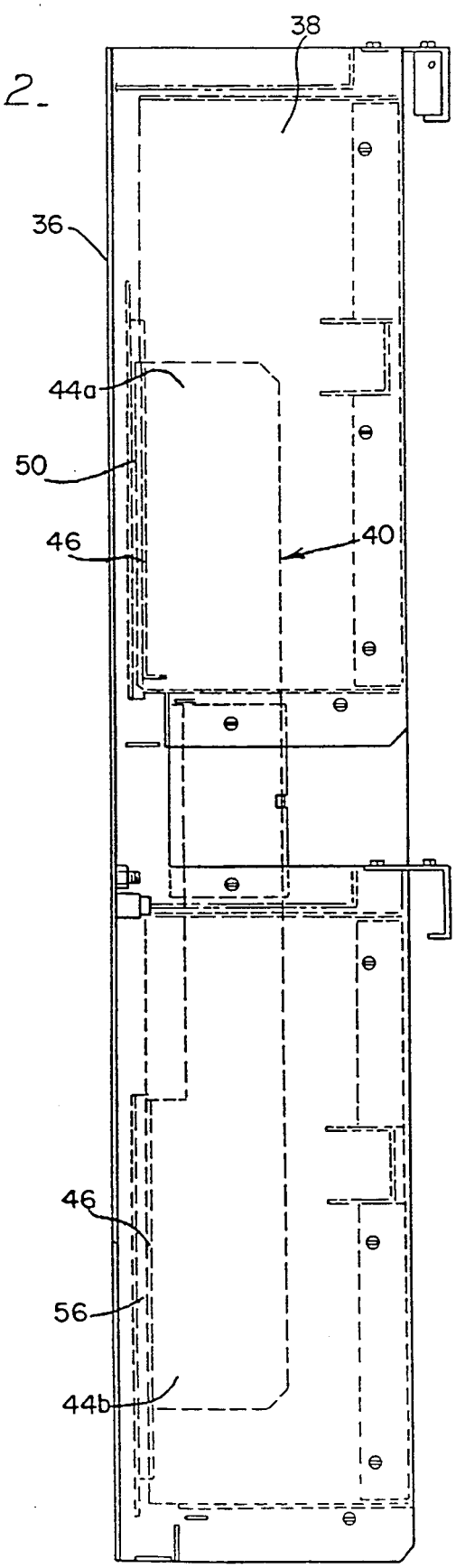
FIG_2.

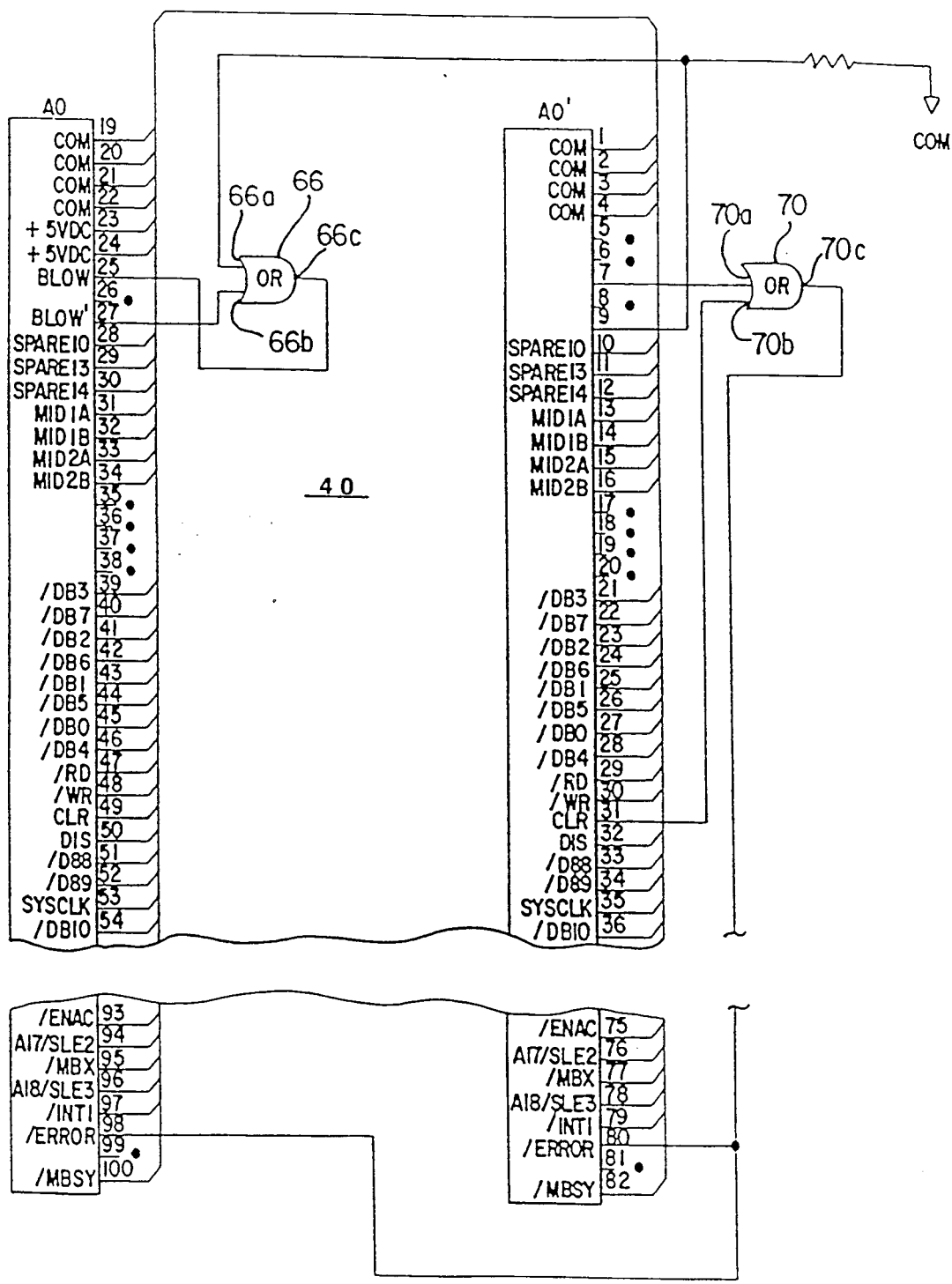
FIG_3

EXPANDED REGISTER RACK FOR A PROGRAMMABLE LOGIC CONTROLLER

DESCRIPTION

1. Technical Field

The invention relates to a programmable logic controller system and, more particularly, to an expanded register rack for a programmable logic controller system which permits use of additional input/output boards and other related devices.

2. Background Prior Art

Processor based devices such as programmable logic controllers, or PLC's, typically are mounted in a register rack assembly which is placed in an electrical housing cabinet. Typically the electrical cabinets are any one of a group of standard dimensions, so the register rack assemblies are also typically made in various respectively corresponding standard dimensions.

The register rack assemblies each typically includes a backplane which contains a plurality of slots, the specific number of which depends on the particular rack dimension.

A programmable controller module comprising a processor board supporting a processor and a memory is received by one of the slots. The processor executes sequential steps of a program stored in the memory.

An input/output, or I/O, module can be received by each of the other remaining slots. Each of the I/O modules can be coupled to many input and output devices. Depending on the total number of input and output devices being monitored and controlled, respectively, many I/O modules can be required.

Because a register rack assembly is of a standard dimension, there is a limitation to the number of I/O modules which can be received by any particular register rack assembly. For example a standard nine-slot register rack assembly can accept one programmable controller module and up to eight I/O modules. If additional I/O modules are required, a second register rack assembly must be utilized. However, in order to couple the two register rack assemblies together, a serial communication board or a bus driver board would have to be placed in one of the slots of both the first and the second register rack assemblies. Accordingly only seven of the nine slots would be available for I/O modules in the first register rack assembly, and only eight of the nine slots would be available for I/O modules in the second register rack assembly.

In addition, the various modules require power supplied by a power supply. The power supply receives its primary source of power from an AC line. In addition, the power supply typically also includes a battery backup for use in the event of a failure of the AC line power or of the power supply itself.

Depending on the power consumption of the modules, often each register rack assembly of a coupled register rack assembly requires its own separate power supply. This arrangement presents a problem because the processor module in the first register rack assembly is unable to monitor the condition of the power supply, including its battery backup, providing power to the second register rack assembly. Thus, a failure of the second register rack assembly power supply would not be detected by the programmable controller module.

The present invention is provided to solve these and other problems.

SUMMARY OF THE INVENTION

It is an object of the invention to provide an expanded register rack assembly for a programmable controller system.

In accordance with the invention, the expanded register rack assembly comprises a first register rack having a first back plane. The first back plane includes a first plurality of slots adapted for receiving a first plurality of printed circuit boards housed within a first plurality of electronic modules. One of the first plurality of electronic modules comprises a programmable controller module including a processor and a memory. The processor executes sequential program steps stored in the memory. The others of the first plurality of electronic modules can be input/output modules, communications modules, or the like.

The expanded register rack assembly further includes a second register rack having a second back plane. The second back plane includes a second plurality of slots adapted for receiving a second plurality of printed circuit boards housed within a second plurality of electronic modules. The second plurality of electronic modules can be input/output modules, communications modules, or the like.

In addition, the expanded register rack assembly includes an extender board for communicatively coupling the electronic modules housed in the first and the second register racks. The extender board permits the programmable controller module to selectively access any of the other of the plurality of electronic modules received in the first and second plurality of slots.

It is comprehended that the expanded register rack assembly includes a first power supply for providing power to each of the first plurality of electronic modules. The first power supply includes a first battery for providing backup power to the first register rack in the event of failure of the first power supply.

The expanded register rack assembly further includes a second power supply for providing power to each of the second plurality of electronic modules. The second power supply includes a second battery for providing power to the second register rack assembly in the event of failure of the second power supply.

The expanded register rack assembly still further includes means for detecting a failure of either of the first and second power supplies, and means responsive to the detecting means for providing an indication of the detected failure.

Other features and advantages of the invention will be apparent from the following specification taken in conjunction with the following drawings.

BRIEF DESCRIPTION OF DRAWINGS

FIG. 1 is an isometric view of an expanded register rack assembly according to the invention;

FIG. 2 is a section of the expanded register rack assembly taken along line 2—2 of FIG. 1 illustrating an extender board according to the invention; and FIG. 3 is a block diagram of the circuit contained on the extender board of FIG. 2.

DETAILED DESCRIPTION

While this invention is susceptible of embodiments in many different forms, there is shown in the drawings and will herein be described in detail, a preferred embodiment of the invention with the understanding that the present disclosure is to be considered as an exemplification of the principles of the invention and is not intended to limit the broad aspects of the invention to the embodiment illustrated.

An electronic module 8 is illustrated in FIG. 1. The electronic module 8 includes a circuit board housing 10 which houses a circuit board 12 having a flange 14.

The flange 14 includes conductive traces 16 which connect with various electrical components mounted on the circuit board 12, as is well known in the art.

As will be discussed in greater detail below, the electronic module 8 can be any of various modules to perform various functions. For example, the electronic module can be a programmable controller module 8a, in which case it would include a processor board 12a supporting, among other components, a processor 18 and a memory 20 coupled thereto. The programmable controller module can be a SY/MAX ® programmable controller sold by Square D Company, Palatine Ill. As is well known in the art, the processor 18 executes steps of a program stored in the memory 20.

The electronic module 8 can also be an input/output (I/O) module 8b, which would be communicatively disposed between the programmable controller module 8a and various I/O devices. The electronic module 8 can further be a communications module 8c, or any other like module used in programmable controller systems, as is well known in the art.

As discussed in greater detail below, the flange 14 of the circuit board 12 is received by a slot 22 in a connector 24 of an expanded register rack assembly 28.

The expanded register rack assembly 28 includes upper and lower register racks 32, 34, respectively, which have a common rear wall, or back plane, 36. The back plane 36 supports the slots 22 of both the upper and the lower register racks 32, 34.

The upper register rack 32 includes first through ninth upper connectors 24a-24i defining respective first through ninth upper module positions 25a-25i. The lower register rack assembly 34 includes first through ninth lower connectors 24j-24r defining respective first through ninth lower module positions 25j-25r. Each of the connectors 24a-24r includes respective first through eighteenth slots 22a-22r.

A common channel housing 38 defines a common channel which extends along the left side (as viewed in FIG. 1) of the upper and lower register racks 32, 34. The common channel housing 38 houses an extender board 40, discussed below.

The programmable controller module 8a is placed in the first upper module position 25a by placing the flange 14 of its processor board 12a into the first slot 22a.

The remaining second through ninth upper module positions 25b-25i and first through ninth lower module positions 24j-24r are available for receiving the other ones of the electronic modules 8, such as the I/O modules 8b or the communication modules 8c described above.

The physical mounting of the various electronic modules 8 in the register racks 32, 34 is explained in greater detail in commonly assigned, patents to Russell et. al., (U.S. Pat. No. 4,956,750 issued 9/11/90 to Russell, (U.S. Pat. No. 4,985,803), the specifications of which are each expressly incorporated by reference.

Upper and lower power supplies 42, 43 provide power to the modules mounted in the upper and lower register racks 32, 34, respectively.

The upper register rack 32 and the lower register rack 34 each include respective upper and lower power supplies 41, 42 which provide power to the various elements of the respective register racks 32, 34. The power supplies 41, 42 can be, for example, Type PS-31, also sold by Square D Company.

Each of the upper and lower power supplies 41, 42 includes a battery 43 for providing backup power, such as to maintain the memory and to provide for an orderly system shutdown, in event of a failure of the respective power supplies 41, 42.

Each of the power supplies 41, 42 generates a BLOW (Battery LOW) signal and an ACFAIL (AC FAILure) signal.

The BLOW signal is a normally low digital signal which changes to a high level when the battery voltage drops below a predetermined level.

The ACFAIL signal is a normally high digital signal which changes to a low level when the respective power supply, 41 or 42, is unable to provide adequate power, such as upon a loss of AC supply power.

Of course, other signal formats could be used without departing from the scope of the invention.

While it is possible to have a single power supply provide power to both the upper and the lower racks 32, 24, the power required would typically exceed the power output of most standard programmable controller power supplies.

The extender board 40 mounted in the common channel 38 is illustrated in FIG. 2.

The extender board 40 has upper and lower flanges 44a, b, each having conductive circuit traces 46 at respective upper and lower ends 48a, b. The upper end 48a is located in the channel housing 38 on the upper register rack 32. The lower end 48b is located in the channel housing 38 in the lower register rack 34. The extender board 40 permits the programmable controller module 8a mounted in the first module position 25a of the upper register rack 32 to communicate with each of the electronic modules 8 mounted in the lower register rack 34.

The upper flange 46a is received in an upper connector 50. The lower end 44b has a lower end flange 52 received in a lower connector 56.

When the two power supplies 41, 42 are utilized, it is important that the programmable controller module 8a monitor the status of both of the power supplies 60. Specifically, it is not just important to know whether either of the power supplies 41, 42 has failed, but rather it is necessary to know which of the power supplies 41, 42 has failed.

As described above, in prior art systems utilizing a programmable controller module operating on I/O modules located in a plurality of register racks, the programmable controller module was unable to monitor the status of remote power supplies, including the condition of their respective backup batteries. The extender board 40 permits the programmable controller module 8a mounted in the upper register rack 32 to monitor the status of the second power supply 42, including its battery.

The extender board 40 is illustrated in FIG. 3.

The upper flange 44a includes eighty-two conductive traces 46 which are each coupled by the extender board 40 to a respective eighty-two conductive traces 46 on the lower flange 44b. The extender board 40 permits transmission of address, data and control signals between the upper and lower register rack assemblies.

The extender board 40 includes a first OR gate 66 having first and second input terminals 66a, b and an output terminal 66c. The BLOW signal from the upper power supply 41 is input to the first input terminal 66a of the first OR gate 66, and the BLOW signal from the lower power supply 42 is input to the second input terminal 66b of the first OR gate 66.

In normal operation with good batteries in each of the power supplies 41, 42, each of the BLOW signals is low. Therefore the voltage at the output terminal 66c of the first OR gate is low.

When one of the power supplies 41, 42 detects a low battery condition, its respective BLOW signal will go high, causing the voltage at the output terminal 66c of the first OR gate 66 to go high.

The programmable controller module 8a monitors the voltage at the first OR gate output terminal 66c, and activates an alarm (not shown) upon detection of a high voltage.

The programmable controller module 8a also monitors the power provided by each of the power supplies 41, 42. As indicated above, each of the power supplies 41, 42 generates a respective ACFAIL signal upon detection of a power supply failure. However as also indicated above, it is important for the programmable controller module 8a to specifically identify which of the power supplies 41, 42 is experiencing the failure.

The SY/MAX® programmable controller module 8a includes a single input terminal for directly monitoring a single ACFAIL signal. Because the programmable controller module 8a must know which of the power supplies 41, 42 failed, the two ACFAIL signals cannot simply be OR'd together. Accordingly, the upper power supply 41 ACFAIL signal is input directly into the ACFAIL input terminal of the programmable controller module 8a.

The extender board 40 includes a second OR gate 70 to permit the programmable controller module 8a to monitor the ACFAIL signal generated by lower power supply 42. The ACFAIL signal generated by the lower power supply 42 is input into a first input terminal 70a of the second OR gate 70. A CLR signal is input into a second input terminal 70b of the second OR gate 70. An output of the second OR gate 70 is joined with a lower rack module error signal.

The CLR signal is normally low, and the ACFAIL signal is normally high. Therefore the output of the second OR gate 70 is normally high.

Upon detection of a failure in the lower power supply 42, its ACFAIL signal goes low, causing the output of the second OR gate 70 to go low, causing the error signal to go low.

The programmable controller responds to the low error signal by setting the CLR signal high. This results in the output of the second OR gate 70 going high and, therefore the error signal going high.

In addition, the programmable controller module 8a responds to the low error signal by polling each of the modules 8 in the lower register rack 34 for an error. Since none of them have an error, the programmable controller module 8a is programmed to conclude that the low error signal was caused by an ACFAIL signal generated by the lower power supply 42.

Thus it can be seen that an expanded register rack has been provided which permits expansion of standard sized register racks. Slots in the register racks are not required to permit communication between the register racks. A programmable controller module mounted in one of the standard register racks can monitor the condition of a power supply, including its battery, providing power to another of the register racks.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. An expanded board register rack assembly for a programmable controller system comprising;
a first standard sized register rack including a first plurality of slots adapted for receiving a first plurality of circuit boards housed within a first plurality of electronic modules, a first one of said first plurality of electronic modules being a programmable controller module which includes a processor and a memory, the processor for executing sequential program steps stored in said memory,
a first power supply;
a second standard sized register rack connected in a vertical juxtaposition to said first register rack, including a second plurality of circuit boards housed within a second plurality of electronic modules,
a second power supply; and
an extender board means for communicatively coupling said first and said second standard sized registered racks, said communicatively coupled means permitting said programmable controller module to selectively access any of said other electronic modules received in said first and second plurality of slots, wherein:
said a first power supply is adapted for coupling to AC line power, said first power supply for providing power to each of said first plurality of electronic modules, said first power supply including a first battery for providing power in event of failure of said AC line power; and
said a second power supply adapted for coupling to AC line power, said second power supply for providing power to each of said second plurality of electronic modules, said second power supply including a second battery for providing power in event of failure of said AC line power, and further including:
means electrically connected to said first and second power supplies for detecting a failure of either of said first and second power supplies; said detecting means generating a signal to identify which of said first or second power supply experienced the failure, and
means responsive to said signal from the detecting means for providing an indication of said detected failure to said programmable controller module.

2. An expanded board register rack assembly for a programmable controller system comprising:
a first standard sized register rack including a first plurality of slots adapted for receiving a first plurality of circuit boards housed within a first plurality of electronic modules, a first one of said first plurality of electronic modules being a programmable controller module which includes a processor and a memory, the processor for executing sequential program steps stored in said memory,
a first power supply;

a second standard sized register rack connected in a vertical juxtaposition to said first register rack, including a second plurality of circuit boards housed within a second plurality of electronic modules, a second power supply; and an extender board means for communicatively coupling said first and said second standard sized registered racks, said communicatively coupling means permitting said programmable controller module to selectively access any of said other electronic modules received in said first and second plurality of slots, wherein:

said first power supply adapted for coupling to AC line power, said first power supply for providing power to each of said electronic modules received in said plurality of module positions, said first power supply including a first battery for providing power in event of failure of said AC line power;

said second power supply adapted for coupling to AC line power, said second power supply for providing power to each of said electronic modules received in said plurality of module positions, said second power supply including a second battery for providing power in event of failure of said AC line power, and further including:

means connected to said communicating coupling means for detecting a failure of either of said first and second power supplies, said means generating a signal to identify which of said first or second power supply experienced the failure; and means responsive to said generating signal of the detecting means for providing an indication of said detected failure to said programmable controller module.

* * * * *